US006819543B2

(12) United States Patent
Vieweg et al.

(10) Patent No.: US 6,819,543 B2
(45) Date of Patent: Nov. 16, 2004

(54) MULTILAYER CAPACITOR WITH MULTIPLE PLATES PER LAYER

(75) Inventors: Raymond A. Vieweg, Phoenix, AZ (US); Dustin P. Wood, Chandler, AZ (US); Nicholas L. Holmberg, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 10/335,571

(22) Filed: Dec. 31, 2002

(65) Prior Publication Data

US 2004/0125540 A1 Jul. 1, 2004

(51) Int. Cl.[7] .............................................. H01G 4/228
(52) U.S. Cl. .................. 361/306.3; 361/306.1
(58) Field of Search ................. 361/309–313, 361/306.1, 321.2, 308.1, 303

(56) References Cited

U.S. PATENT DOCUMENTS

| | | | |
|---|---|---|---|
| 4,424,552 A | 1/1984 | Saint Marcoux | 361/301.4 |
| 4,590,537 A | 5/1986 | Sakamoto | 361/306 |
| 4,831,494 A | 5/1989 | Arnold et al. | 361/306 |
| 4,947,286 A | 8/1990 | Kaneko et al. | 361/321.2 |
| 5,166,858 A | 11/1992 | Frake et al. | 361/313 |
| 5,639,507 A | 6/1997 | Galvagni | 427/79 |
| 5,880,925 A | 3/1999 | DuPre et al. | |
| 5,973,910 A | 10/1999 | Gardner | 361/313 |
| 6,064,108 A | 5/2000 | Matinez | 257/532 |
| 6,178,083 B1 | 1/2001 | Appeltans et al. | 361/306.1 |
| 6,188,565 B1 | 2/2001 | Naito et al. | 361/303 |
| 6,195,249 B1 * | 2/2001 | Honda et al. | 361/306.3 |
| 6,215,647 B1 | 4/2001 | Naito et al. | 361/303 |
| 6,222,246 B1 | 4/2001 | Mak et al. | 257/532 |
| 6,226,169 B1 | 5/2001 | Naito et al. | 361/303 |
| 6,243,253 B1 | 6/2001 | DuPre et al. | 361/306 |
| 6,266,228 B1 | 7/2001 | Naito et al. | 361/306.1 |
| 6,266,229 B1 | 7/2001 | Naito et al. | 361/306.3 |
| 6,292,350 B1 | 9/2001 | Naito et al. | 361/306.3 |
| 6,324,048 B1 | 11/2001 | Liu | 361/306.1 |
| 6,327,134 B1 | 12/2001 | Kuroda et al. | 361/303 |
| 6,331,930 B1 | 12/2001 | Kuroda et al. | 361/306.3 |
| 6,344,961 B1 | 2/2002 | Naito et al. | 361/302 |
| 6,407,904 B1 | 6/2002 | Kuroda et al. | 361/303 |
| 6,430,025 B2 | 8/2002 | Naito et al. | 361/303 |
| 6,442,813 B1 | 9/2002 | Sakamoto et al. | 29/25.42 |
| 6,459,561 B1 | 10/2002 | Galvagni et al. | 361/306.3 |
| 6,462,932 B1 | 10/2002 | Naito et al. | 361/306.1 |
| 6,483,692 B2 | 11/2002 | Figueroa et al. | 361/308.1 |
| 6,549,395 B1 | 4/2003 | Naito et al. | 361/306.1 |
| 2002/0047154 A1 | 4/2002 | Sowlati et al. | 257/307 |
| 2002/0071258 A1 | 6/2002 | Mosley | 361/782 |
| 2002/0085334 A1 | 7/2002 | Figueroa | |
| 2002/0135481 A1 | 9/2002 | Figueroa et al. | |

* cited by examiner

Primary Examiner—Anthony Dinkins
(74) Attorney, Agent, or Firm—Schwegman, Lundberg, Woessner & Kluth, P.A.

(57) ABSTRACT

A capacitor including a plurality of layers each including a plurality of conductive plates is described. A gap separates conductive plates on a same layer. The conductive plates on a single layer assures that the total capacitance of each layer is not lost if all connections to one plate are defective. Each of the conductive plates includes a plurality of connection points or tabs to provide a redundancy of connections to each plate. The greater the number of connection points in the capacitor the lower the inductance and resistance. The gaps extend in a first direction for a first pair of layers and extend in a second direction for a second pair of layers. Systems connecting the capacitor to a die are also described. The length of the conductive material connecting the capacitor to the die is short, and the inductance and resistance of the conductive material is low.

18 Claims, 6 Drawing Sheets

MULTILAYER CAPACITOR WITH MULTIPLE PLATES PER LAYER

FIELD

This application relates to a capacitor and, more particularly, to a multilayer capacitor.

BACKGROUND

Capacitors are used in integrated circuit systems for a variety of functions including power decoupling, noise filtering, and resonance damping. Power decoupling assists in preventing a drop in voltage levels at input/output terminals of an integrated circuit die. Sudden increased power demands of the die can cause a drop in voltage levels at the die terminals. This voltage drop on the die increases the switching time of the transistors on the die, which degrades the performance of the system fabricated on the die. Typically, discrete decoupling capacitors are mounted adjacent to the die and connected to the conductors that provide power to the die. For a processor die, the die is mounted on a substrate, and a ring of capacitors, usually ten to fifteen two microfarad capacitors, are mounted on the substrate along the periphery of the die. These capacitors are coupled to the power supply connections at the die through lands formed on the substrate. However, there are problems associated with such power decoupling. For example, a large number of capacitors may be required to adequately control the voltage drop. A large number of capacitors consumes valuable real estate on a substrate. Further adding longer leads from the power supply to the die terminals to accommodate the capacitors increases inductance and resistance, which hampers the prevention of voltage drop and limits power decoupling at higher frequencies.

For these and other reasons there is a need for the present invention.

DESCRIPTION

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1:
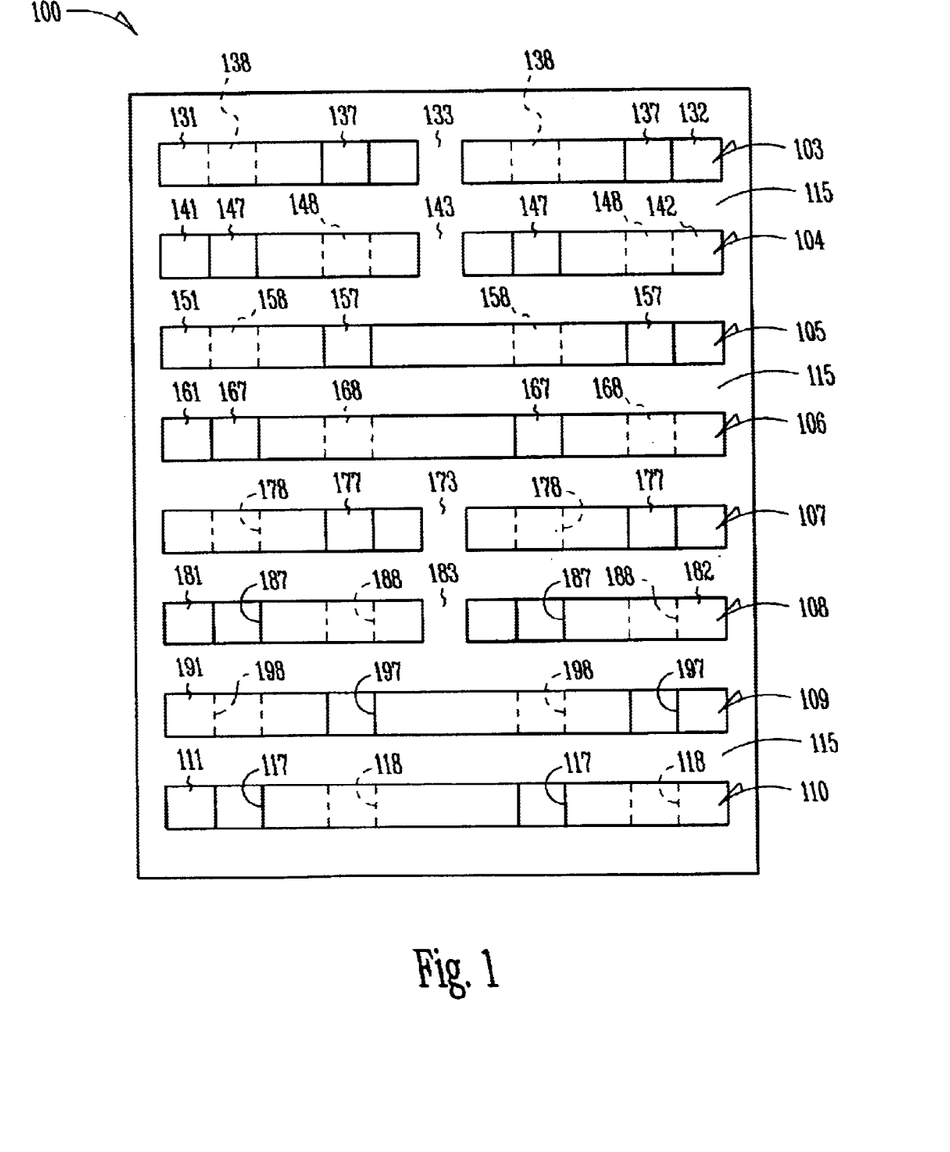
FIG. 1 shows an elevational perspective view of a capacitor.

FIG. 1 shows an elevational view of a capacitor 100. Capacitor 100, in an embodiment, is a multilayer capacitor including a first plurality of conductive layers 103, 105, 107, and 109 interleaved with a second plurality of conductive layers 104, 106, 108, and 110. A dielectric layer 115 separates adjacent conductive layers. The first plurality of layers 103, 105, 107, and 109 are adapted to be connected to a first node in a circuit. In an embodiment, the first node is a ground. The second plurality of layers 104, 106, 108, and 110 are adapted to be connected to a second node in a circuit. In an embodiment, the second node provides a positive potential to the second plurality of plates. For example, the second node is a terminal on a die that contains integrated circuits. While shown with eight layers 103–110, it will be understood that the number of layers may be greater than eight in an embodiment. In another embodiment, the number of layers is less than eight. Capacitance is determined by the surface area of the plates and the distance between the plates, generally the greater the surface area, smaller the distance between the plates and/or greater the dielectric constant, the greater the capacitance.

Figure 3A:
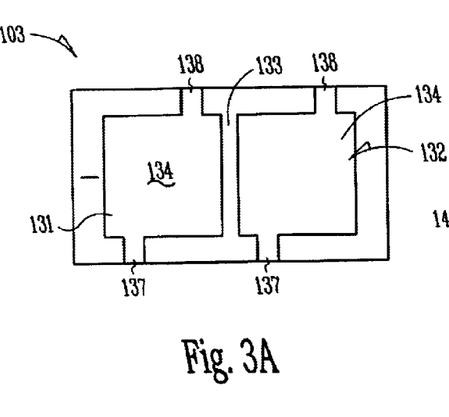
FIG. 3A shows a plan view of a first layer of a capacitor.

Each conductive layer includes a plurality of conductive plates. Referring to layer 103, it includes a first plate 131 and a second plate 132 separated by a nonconductive gap 133 (FIGS. 1 and 3A). Each plate 131, 132 includes a generally rectangular body 134 and a plurality of contact tabs 137, 138 extending outwardly from each of bodies 134. A tab 137 extends from a first side of each of bodies 134. A tab 138 extend from a second side of each of bodies 134. Tabs 138 are laterally offset from and extend parallel to tabs 137. In an embodiment, plate 131 is shaped identically to plate 132. In an embodiment, gap 133 is elongate and runs orthogonal to two sides of bodies 134. Gap 133 further extends in the same direction as tabs 137, 138. Gap 133 has a width that is made as small as possible to provide the maximum surface area for the two plates 131, 132 in layer 103. In an embodiment, the width of gap 133 is about 50–200 microns. In an embodiment, the width of gap 133 is less than or equal to 50 microns. The gap 133 is filled with a non-conductive material, such as the same material as dielectric layers 115.

Figure 3B:
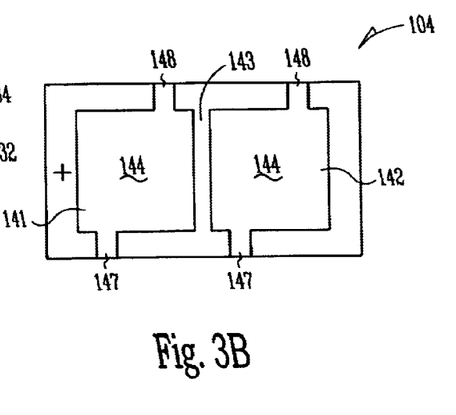
FIG. 3B shows a plan view of a second layer of a capacitor.

Layer 104 underlies layer 103. Layer 104 includes a first plate 141 and a second plate 142 separated by a nonconductive gap 143 (FIGS. 1 and 3B). Each plate 141, 142 includes a generally rectangular body 144 and a plurality of contact tabs 147, 148 extending outwardly from each of bodies 144. A tab 147 extends from a first side of each of the bodies 144. A tab 148 extends from a second side of each of bodies 144. Tabs 148 are laterally offset from and extend parallel to tabs 147. Accordingly, no two tabs in conductive layers 103 and 104 are vertically aligned with any other tab from these layers. In an embodiment, gap 143 is elongate and runs orthogonal to two sides of body 144. Gap 143 further extends in the same direction as gap 133 and is vertically aligned with gap 133. Gap 143 has a width that is made as small as possible to provide the maximum surface area for the two plates 141, 142 in layer 104. In an embodiment, the width of gap 143 is about 50–200 microns. In an embodiment, the width of gap 143 is less than or equal to 50 microns. The gap 143 is filled with a non-conductive material, such as the same material as dielectric layers 115.

Figure 3C:
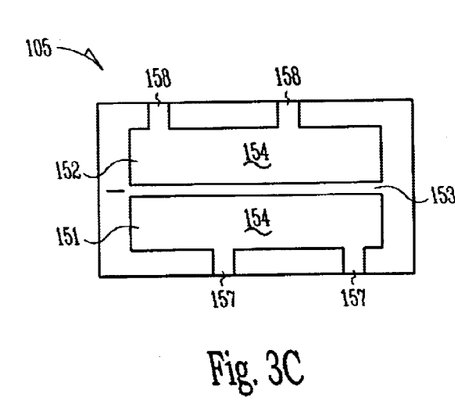
FIG. 3C shows a plan view of a third layer of a capacitor.

Layer 105 underlies layer 104. Layer 105 includes a first plate 151 and a second plate 152 separated by a non-conductive gap 153 (FIGS. 1 and 3C). Plate 151 includes a generally rectangular body 154 and a plurality of contact tabs 157 extending outwardly from body 154. Tabs 157 extend from a first side of body 154 of plate 151 remote from gap 153. Plate 152 includes a generally rectangular body 154 and a plurality of contact tabs 158 extending outwardly from body 154. Tabs 158 extend from a second side of body 154 of plate 152 and are laterally offset from tabs 157 of plate 151. The second side of body 154 of plate 152 is remote from the gap 153. In an embodiment, gap 153 is elongate and runs orthogonal to two, aligned sides of bodies 154. Gap 153 further extends perpendicular to tabs 157, 158 and traverse to the direction of gaps 133, 143. Gap 153 has a width that is made as small as possible to provide the maximum surface area for the two plates 151, 152 in layer 105. In an embodiment, the width of gap 153 is about 50–200 microns. In an embodiment, the width of gap 153 is less than or equal to 50 microns. The gap 153 is filled with a non-conductive material, such as the same material as dielectric layers 115.

Figure 3D:
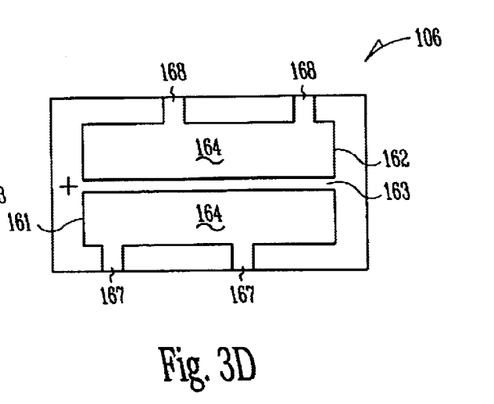
FIG. 3D shows a plan view of a fourth layer of a capacitor.

Layer 106 underlies layer 105. Layer 106 includes a first plate 161 and a second plate 162 separated by a non-conductive gap 163 (FIGS. 1 and 3D). Plate 161 includes a generally rectangular body 164 and a plurality of contact tabs 167 extending outwardly from body 164. Tabs 167 extend from a first side of body 164 of plate 161 remote from gap 163. Plate 162 includes a generally rectangular body 164 and a plurality of contact tabs 168 extending outwardly from body 164. Tabs 168 extend from a second side of body 164 of plate 162 remote from gap 163. Tabs 168 are laterally offset from tabs 167. In an embodiment, gap 163 is elongate and runs orthogonal to two, aligned sides of bodies 164. Gap 163 further extends perpendicular to tabs 167, 168 and traverse to the direction of gaps 133, 143. In an embodiment, gap 163 is vertically aligned with gap 153. Gap 163 has a width that is made as small as possible to provide the maximum surface area for the two plates 161, 162 in layer 106. In an embodiment, the width of gap 163 is about 50–200 microns. In an embodiment, the width of gap 163 is less than or equal to 50 microns. The gap 163 is filled with a non-conductive material, such as the same material as dielectric layers 115.

Figure 2:
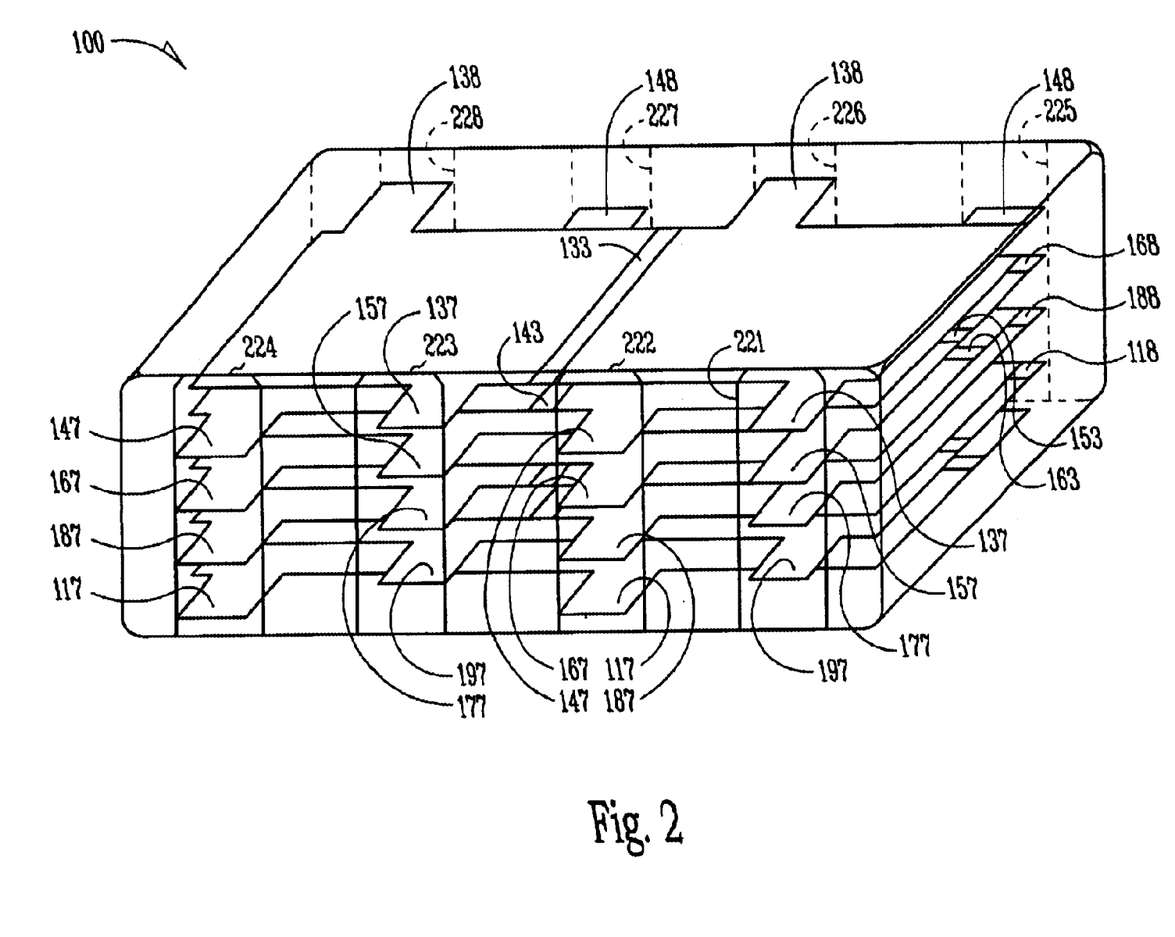
FIG. 2 shows perspective view of a capacitor.

Conductive layers 107, 108, 109, and 110 are the same as layers 103, 104, 105, and 106, respectively. Accordingly, these layers are not described in detail. Elements of layers 107, 108, and 109 that are the same as described above with respect to layers 103–105 are designated with reference numbers that are the same as above with the center digit replaced by the last digit of the layer number. For example, tab 173 of layer 107 corresponds to and is the same as tab 137 of layer 103 except the tabs 173 and 137 arE on different layers in capacitor 100. Elements of layer 10 use the same reference numbers as layer 106 with the center digit changed to 1. For example, tab 118 of layer 10 is the same as tab 168 of layer 106 except tab 118 is on a different layer in capacitor 100. Capacitor 100, in an embodiment, includes a repeating pattern of layers 103–106 as described above. While only shown with layers 106–110, it is understood that more layers similar to those described herein may be added to capacitor 100 to increase its capacitance. For example, embodiments of capacitor 100 may include tens of layers or hundreds of layers. In an embodiment, capacitor 100 includes at least layers 103–106. In an embodiment, capacitor 100 includes a pair of layers that includes gaps that are aligned in a first direction, e.g., vertically as shown in FIGS. 1–3. A successive pair of layers includes gaps that are aligned in the first direction and extend in a non-parallel direction with respect to the adjacent pairs of layers. In an embodiment, the gaps of one pair of layers extend generally perpendicular to the gaps of any adjacent pair of layers. For example, the pair of layers 105, 106 include gaps 153, 163 that are vertically aligned (FIG. 2). Gaps 153, 163 extend generally perpendicular to the direction of gaps 133, 143 and 173, 183 of the adjacent pairs of layers 103, 104 and 107, 108.

FIG. 2 shows capacitor 100 including its plurality of terminal connections 221–228. Terminal connections 221–228 provide connections between the capacitor plates in capacitor 100 and external circuits. Connection 221 connects to tabs 137, 157, 177 and 197, which are vertically aligned with each other. Accordingly, plates 132, 151, 172, and 191 are all connected to connection 221. Connection 222 connects to tabs 147, 167, 187 and 117, which are vertically aligned with each other. Accordingly, plates 142, 161, 182, and 111 are all connected to connection 222. Connection 223 connects to tabs 137, 157, 177 and 197, which are vertically aligned with each other. Accordingly, plates 131, 151, 171 , and 191 are all connected to connection 223. Connection 224 connects to tabs 147, 167, 187 and 117, which are vertically aligned with each other. Accordingly, plates 141, 161, 181, and 111 are all connected to the potential provided to connection 221. Each of connections 221–224 are edge contacts that extend vertically on one side of capacitor 100.

The backside, referring to FIGS. 1 and 2, of capacitor 100 includes a plurality of connections 225–228, which are edge contacts extending vertically on a same side of the capacitor 100. Connection 225 connects to tabs 148, 168, 188 and 118, which are vertically aligned with each other. Accordingly, plates 142, 162, 182, and 112 are all connected to connection 225. Connection 226 connects to tabs 138, 158, 178 and 198, which are vertically aligned with each other. Accordingly, plates 132, 152, 172, and 192 are all connected to connection 226. Connection 227 connects to tabs 148, 168, 188 and 118, which are vertically aligned with each other. Accordingly, plates 141, 162, 181, and 112 are all connected to connection 227. Connection 228 connects to tabs 138, 158, 178 and 198, which are vertically aligned with each other. Accordingly, plates 131, 152, 171, and 112 are all connected to the potential provided to connection 228.

In an embodiment, connections 221, 223, 226, and 228 are all connected to a same first node provided by an external circuit. Connections 222, 224, 225, and 227 are all connected to a same second node provided by the external circuit. In an embodiment, the first node is connected to a first potential and the second node is connected to a second potential. The first potential is less than the second potential. In an embodiment, the first potential is ground and the second potential is a positive voltage to charge plates 141, 142 of layer 104, plates 161, 162 of layer 106, plates 181, 182 of layer 108 and plates 111, 112 of layer 110 during a charging operation of the capacitor 100. When needed the positively charged plates 141, 142, 161, 162, 181, 182, 111, and 112 provide electrical charge to a circuit. In an embodiment, connections 221, 223, 226, and 228 are connected to the first node having a greater potential than the second node connected to connections 222, 224, 225, and 227.

Capacitor 100 includes a plurality of capacitor plates in each conductive layer of the capacitor. Each of the plates includes a plurality of connection tabs that are in turn connected to other connection tabs on plates in a different layer. The plurality of tabs per plate provides a desired redundancy of connections to a plate to ensure that if a connection to one tab is defective, there is another connection to that plate. Moreover, a plurality of distinct plates on one layer in the capacitor provides a redundancy that protects the overall capacitance. Specifically, if all connections to one plate are defective, then only that portion of the conductive layer is lost. In the embodiment of FIG. 2, if connection to front tab 137 of plate 132 is defective, then plate 132 would connect to an external circuit through back tab 138. If both front tab 137 and back tab 138 are both defective, then only plate 132 would be lost from capacitor layer 103. That is, plate 131 of layer 103 would still contribute to the capacitive properties of capacitor 100.

Capacitor 100 further includes gaps that alternate directions between each pair of plates that form a capacitor structure. Thus, if any connections 221–228 are disconnected, then all capacitance in capacitor 100 is maintained as same polarity plates on subsequent layers extend in different directions and are adjacent opposite polarity plates.

Capacitor 100 includes a plurality of different capacitor structures that are added together to provide a total capacitance. Specifically, plates 131 and 141 form one capacitor structure. Plates 132 and 142 for another capacitor structure. Plates 151 and 161 form another capacitor structure. Plates 152 and 162 form yet another capacitor structure. Similar capacitor structures are formed by the plates in layers 107–110.

Figure 4:
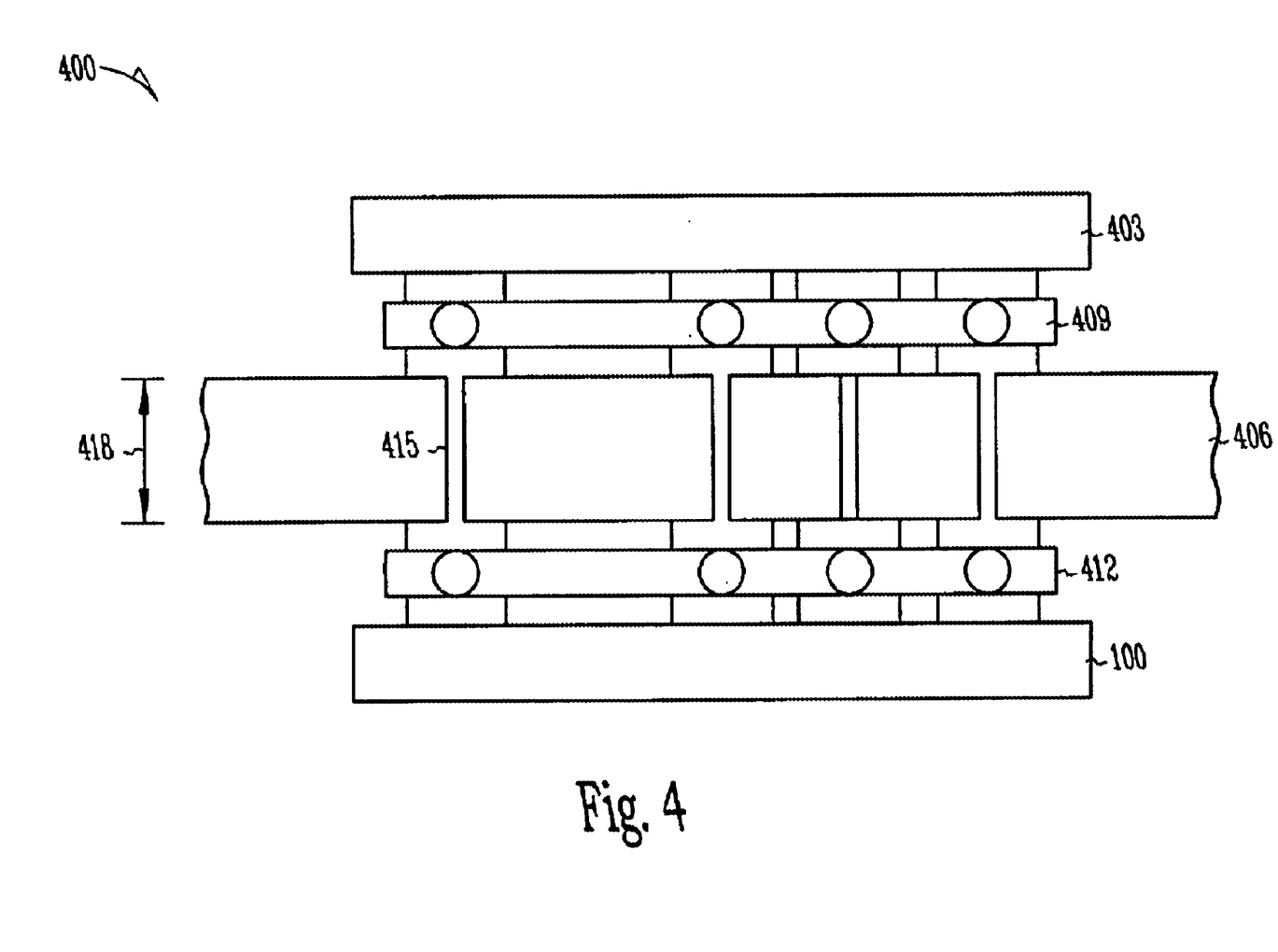
FIG. 4 is an illustration of a cross-sectional view of one embodiment of a system including a die and a capacitor coupled to a substrate.

FIG. 4 shows a cross-sectional view of one embodiment of system 400 for coupling die 403 to capacitor 100 through common substrate 406. In an embodiment, die 403 includes an electronic device, such as a processor, a communication system, or an application specific integrated circuit. Die 403 is coupled to a first surface of substrate 406 by controlled collapse chip connection (C4) 409. Capacitor 100 is coupled to a second surface of substrate 406 by mechanical or electrical connection 412. Examples of connection 412 include surface mount or controlled collapse chip connection. Conductive interconnects 415 extend from the first surface to the second surface of substrate 406 to couple capacitor 100 to die 403. In an embodiment, interconnects 415 are formed by filling a via in the substrate 406 with a conductive material, such as metal. In one embodiment, substrate 406 is fabricated from a ceramic material. Alternatively, substrate 406 is fabricated from an organic material. Preferably, substrate 406 is thin, which permits a short coupling distance between capacitor 100 and die 403. In one embodiment, substrate 406 has a thickness 418 of less than about 1 millimeter, which reduces the length of interconnects 415. A short coupling distance reduces the inductance and resistance in the circuit in which capacitor 100 is connected.

Figure 5:
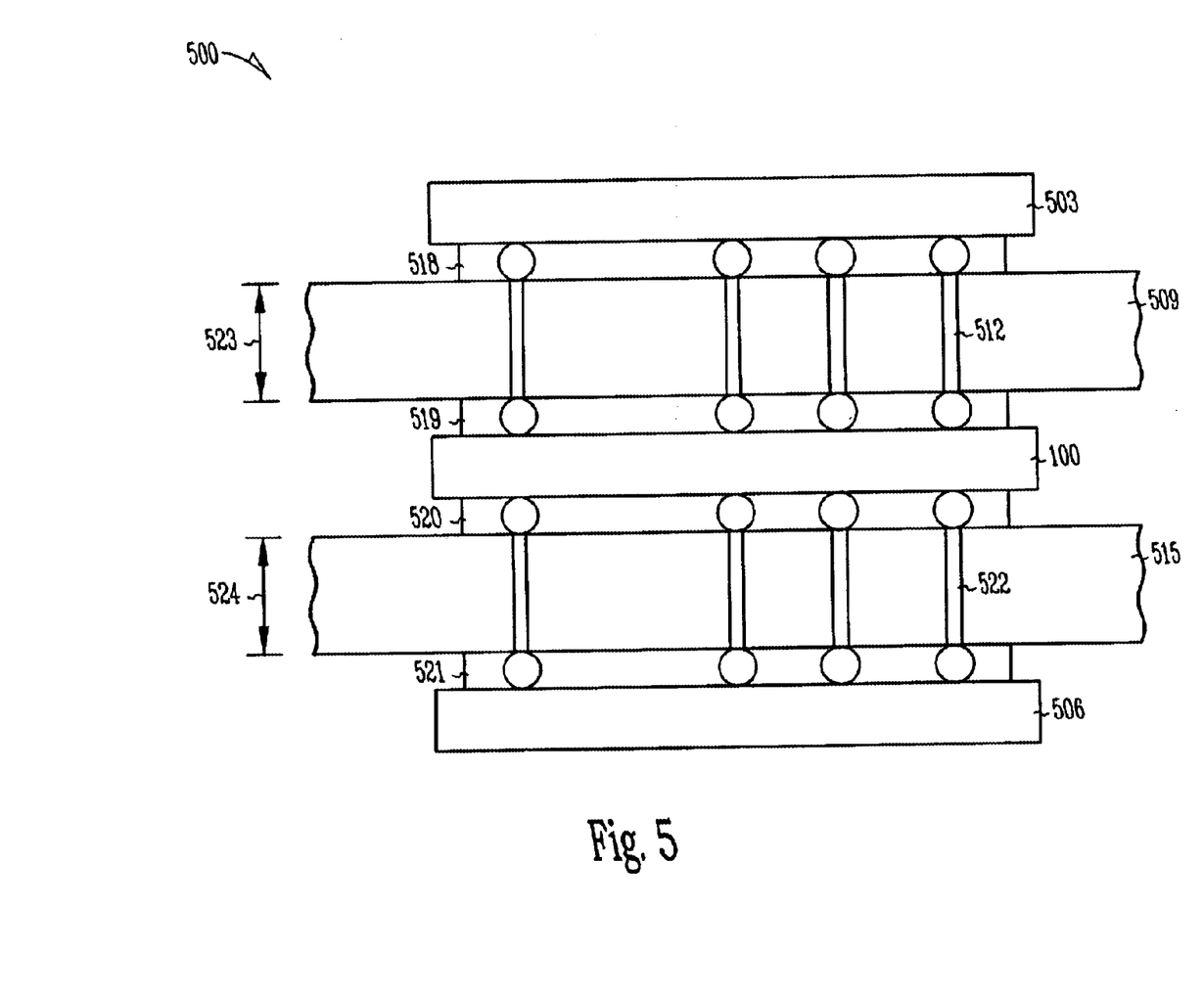
FIG. 5 is an illustration of a cross-sectional view of some embodiments of a system including capacitor coupled to a plurality of electronic dies.

FIG. 5 shows a cross-sectional view of some embodiments of system 500 including capacitor 100 coupled to electronic dies 503 and 506. Substrate 509 provides a foundation for mounting die 503 to capacitor 100. In addition, substrate 509 couples die 503 to capacitor 100 through conductive interconnects 512. Similarly, substrate 515 provides a foundation for mounting die 506 to capacitor 100. Substrate 515 couples die 506 to capacitor 100 through conductive interconnects 522. Connections, such as surface mount, controlled collapse chip connections or other solder ball connections, 518–521 physically and electrically couple die 503, die 506 and capacitor 100 to 509 and 515. For substrate 509 having a thickness 523 of less than about 1 millimeter and substrate 515 having a thickness 524 of less than about 1 millimeter, the resistance and inductance of capacitor 100 and vias 512 and 522 is lower than resistance and inductances in assemblies with thicker substrates. In an embodiment, system 500 provides for decoupling power supply connections at die 503 and 506 by packaging dies 503, 506 and capacitor 100 as described above.

Figure 6:
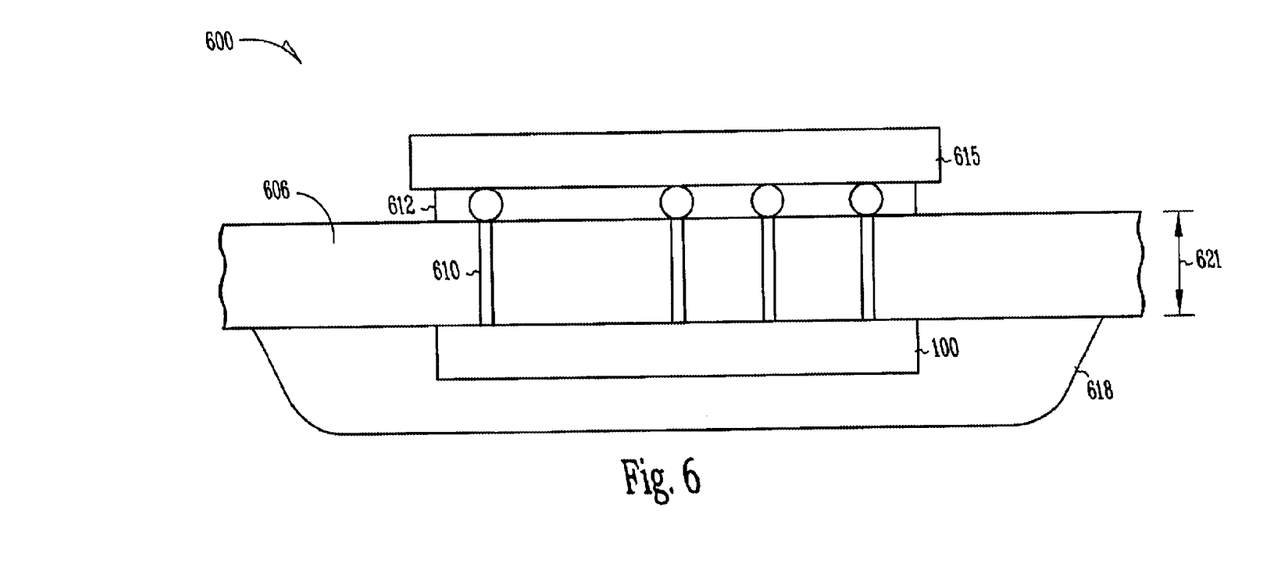
FIG. 6 is an illustration of a cross-sectional view of some embodiments of a system including a capacitor coupled to a dielectric substrate and electrically coupled to a die.

FIG. 6 shows a cross-sectional view of some embodiments of a system 600 including capacitor 100 coupled to substrate 606 and electrically coupled by interconnects 610 and controlled collapse chip connection 612 to die 615. In an embodiment, capacitor 100 is coupled to power supply connections on die 615 to decouple the power supply connections at the die. Capacitor 100 is protected from the environment by molding 618. In one embodiment, substrate 606 is formed from a low K dielectric and has a thickness 621 of between about 0.05 millimeters and about 0.1 millimeters. A dielectric thickness of between about 0.05 millimeter and 0.1 millimeter allows system 600 to be fabricated with shorter capacitor leads than the capacitor leads in system 500. As described above, a system having short leads between capacitor 100 and die 615 results in a capacitor having a low inductance and a low resistance, which improves the performance of the system.

Figure 7:
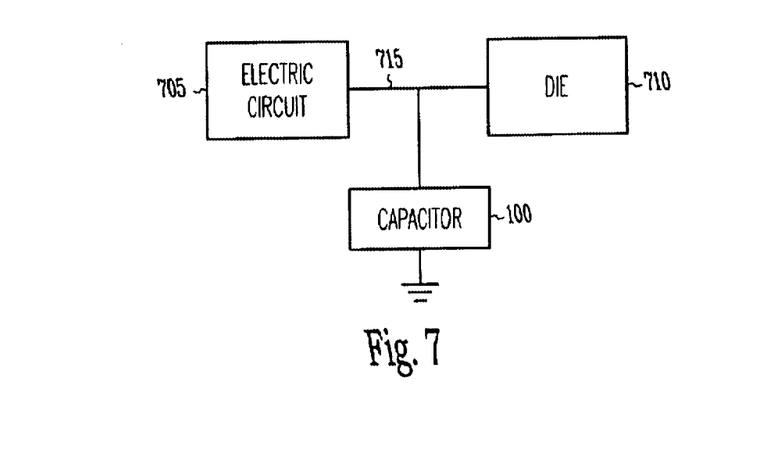
FIG. 7 shows a system including a capacitor as described herein.

FIG. 7 shows a system 700 including an electrical circuit 705 and a die 710 operably connected together through an electrically conductive line 715. In an embodiment, line 715 is a power supply line. In an embodiment, line 715 is a data input/output line. Capacitor 100 is connected to conductive line 100. In an embodiment, a first group of capacitor plates are connected to line 715 through a first group of connection tabs. A second group of capacitor plates are connected to a node in the electric circuit 705 through a second group of connection tabs. In an embodiment, the node is a grounded node.

As described in the embodiments above capacitor 100 comprises a plurality of conductive layers embedded in a dielectric material. The capacitor further includes a plurality of capacitor plates in at least one of the conductive layers separated by a gap. In an embodiment, at least one adjacent gap is skewed about 90 degrees with respect to a gap in an adjacent layer. In an embodiment, gaps of one pair of layers extend in a first direction and gaps in a second pair of layers extends in a second direction skewed with respect to the first direction. Each capacitor plate includes a plurality of connector tabs. In an embodiment, each layer in capacitor 100 includes a plurality of capacitor plates.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A capacitor, comprising:
    a plurality of conductive layers separated by a dielectric layer;
    a first plate and a second plate in a first of the plurality of conductive layers, the first and second plates being separated by a first gap;
    a plurality of first tabs on the first plate; and
    a plurality of second tabs on the second plate.

2. The capacitor of claim 1, wherein the plurality of conductive layers includes a second conductive layer comprising a third plate and a fourth plate separated by a second gap.

3. The capacitor of claim 2, wherein the first gap extends in a first direction and the second gap extends in the first direction, and wherein the first conductive layer is adjacent the second conductive layer.

4. The capacitor of claim 2, wherein the first gap extends in a first direction and the second gap extends in a second direction, and wherein the second direction is non-parallel to the first direction.

5. The capacitor of claim 4, wherein the second direction is generally perpendicular to the first direction.

6. The capacitor of claim 5, wherein the first conductive layer is adjacent the second conductive layer.

7. The capacitor of claim 1, wherein the plurality of conductive layers include a first group of layers interleaved with a second group of layers, the first group of layers being adapted to connected to a first node, and the second group of layers being adapted to connected to a second node.

8. A system, comprising:
a substrate;
a die operably connected to the substrate; and
a capacitor operably connected to the die, wherein the capacitor includes:
  a plurality of conductive layers;
  a plurality of plates in at least one of the plurality of conductive layers, the plurality of plates being separated from each other by a non-conductive gap; and
  a plurality of connections to at least one of the plurality of plates.

9. The system of claim 8, wherein the circuit includes a conductive line, wherein the die includes a terminal connected to the conductive line, and wherein plurality of connections include a first group of connections connected to the conductive line and a second group of connections connected to a node.

10. The system of claim 8, wherein the substrate includes a first side and a second side, and wherein the die is connected to the first side, and wherein the capacitor is connected to the second side.

11. The substrate of claim 10, wherein the substrate includes a plurality of interconnects extending from the first side to the second side and connecting the capacitor to the die.

12. A multilayer capacitor, comprising:
a first side;
a second side;
a first conductive layer including a first plate and a second plate separated by a first non-conductive gap, the first plate and the second plate each including at least one first connection tab at the first side and at least one second connection tab at the second side;
a second conductive layer including a third plate and a fourth plate separated by a second non-conductive gap, the third plate and the fourth plate each including at least one first connection tab at the first side and at least one second connection tab at the second side;
a first dielectric layer intermediate the first conductive layer and the second conductive layer;
a third conductive layer including a fifth plate and a sixth plate separated by a third non-conductive gap, the fifth plate including a plurality of first connection tabs at the first side, the sixth plate including a plurality of second connection tabs at the second side;
a fourth conductive layer including a seventh plate and an eighth plate separated by a fourth non-conductive gap, the seventh plate including a plurality of first connection tabs at the first side, the eighth plate including a plurality of second connection tabs at the second side; and
a second dielectric layer intermediate the third conductive layer and the fourth conductive layer.

13. The capacitor of claim 12, wherein the first non-conductive gap and the second non-conductive gap extend in a first direction, and wherein the third non-conductive gap and the fourth non-conductive gap extend in a second direction, the second direction being non-parallel to the first direction.

14. The capacitor of claim 13, wherein the second direction is skewed about 90 degrees to the first direction.

15. The capacitor of claim 14, wherein the first side includes first, second, third and fourth connections, the first connection being connected to the first tabs of the second plate and the sixth plate, the second connection being connected to the first tabs of the third plate and the seventh plate, the third connection being connected to first tabs of the first plate and the fifth plate, and the fourth connection being connected to the first tabs of the third plate and the seventh plate.

16. The capacitor of claim 15, wherein the second side includes fifth, sixth, seventh and eighth connections, the fifth connection being connected to the second tabs of the fourth plate and the eighth plate, the sixth connection being connected to the second tabs of the second plate and sixth plate, the seventh connection being connected to second tabs of the fourth plate and the eighth plate, the eighth connection being connected to the second tabs of the first plate and the fifth plate.

17. The capacitor of claim 16, wherein the first, second, third, fourth, fifth, sixth, seventh, and eighth connections extend generally parallel to each other.

18. The capacitor of claim 17, wherein the first, third, sixth and eighth connections are connected to a first node, and wherein the second, fourth, fifth, and seventh connections are connected to a second node.

* * * * *